(12) United States Patent
Nguyen et al.

(10) Patent No.: US 8,737,132 B2
(45) Date of Patent: *May 27, 2014

(54) CHARGE CYCLING BY EQUALIZING THE SOURCE AND BIT LINE LEVELS BETWEEN PULSES DURING NO-VERIFY WRITE OPERATIONS FOR NAND FLASH MEMORY

(75) Inventors: Hao Thai Nguyen, San Jose, CA (US); Juan Carlos Lee, Sunnyvale, CA (US); Seungpil Lee, San Ramon, CA (US); Jongmin Park, Cupertino, CA (US); Man Lung Mui, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/570,826

(22) Filed: Aug. 9, 2012

(65) Prior Publication Data

US 2013/0176790 A1 Jul. 11, 2013

Related U.S. Application Data

(60) Provisional application No. 61/583,764, filed on Jan. 6, 2012.

(51) Int. Cl.
*G11C 16/04* (2006.01)

(52) U.S. Cl.
USPC ............. 365/185.19; 365/185.03; 365/185.18

(58) Field of Classification Search
USPC ............................ 365/185.19, 185.03, 185.18
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,172,338 | A | 12/1992 | Mehrotra et al. |
| 5,218,569 | A | 6/1993 | Banks |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |

(Continued)

FOREIGN PATENT DOCUMENTS

| | | |
|---|---|---|
| EP | 0 856 850 A2 | 8/1998 |
| JP | 2000-040382 A | 2/2000 |

(Continued)

OTHER PUBLICATIONS

Eitan et al., "Nrom: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Connie Yoha
(74) *Attorney, Agent, or Firm* — Davis Wright Tremaine LLP

(57) ABSTRACT

In non-volatile memory devices, a write typically consists of an alternating set of pulse and verify operations. At the end of a pulse, the device must be biased properly for an accurate verify, after which the device is re-biased for the next pulse. In some cases a non-volatile memory is programmed by an alternating set of pulses, but, for at least some pulses without any intervening verify operations. After a one pulse, but before biasing the memory for the next pulse without an intervening very, the source and bit line levels can be left to float.

10 Claims, 14 Drawing Sheets

(56) References Cited

U.S. PATENT DOCUMENTS

| | | | |
|---|---|---|---|
| 5,595,924 A | 1/1997 | Yuan et al. | |
| 5,610,859 A | 3/1997 | Nakamura et al. | |
| 5,661,053 A | 8/1997 | Yuan | |
| 5,768,192 A | 6/1998 | Eitan | |
| 5,862,096 A | 1/1999 | Yasuda et al. | |
| 5,903,495 A | 5/1999 | Takeuchi et al. | |
| 5,920,507 A | 7/1999 | Takeuchi et al. | |
| 5,963,475 A | 10/1999 | Choi et al. | |
| 6,011,725 A | 1/2000 | Eitan | |
| 6,028,792 A | 2/2000 | Tanaka et al. | |
| 6,046,935 A | 4/2000 | Takeuchi et al. | |
| 6,134,140 A | 10/2000 | Tanaka et al. | |
| 6,185,134 B1 | 2/2001 | Tanaka | |
| 6,222,762 B1 | 4/2001 | Guterman et al. | |
| 6,243,290 B1 | 6/2001 | Kurata et al. | |
| 6,324,121 B2 | 11/2001 | Banks | |
| 6,327,189 B2 | 12/2001 | Banks | |
| 6,339,545 B2 | 1/2002 | Banks | |
| 6,343,034 B2 | 1/2002 | Banks | |
| 6,344,998 B2 | 2/2002 | Banks | |
| 6,404,675 B2 | 6/2002 | Banks | |
| 6,522,580 B2 | 2/2003 | Chen et al. | |
| 6,538,922 B1 | 3/2003 | Khalid et al. | |
| 6,745,286 B2 | 6/2004 | Staub et al. | |
| 6,785,164 B2 | 8/2004 | Gonzalez et al. | |
| 7,158,421 B2 | 1/2007 | Li et al. | |
| 7,243,275 B2 | 7/2007 | Gongwer et al. | |
| 7,434,111 B2 | 10/2008 | Sugiura et al. | |
| 7,457,162 B2 | 11/2008 | Guterman et al. | |
| 7,619,930 B2 | 11/2009 | Mokhlesi | |
| 7,643,348 B2 | 1/2010 | Cernea | |
| 7,751,245 B2 * | 7/2010 | Sarin et al. | 365/185.18 |
| 7,800,945 B2 | 9/2010 | Cernea | |
| 8,355,283 B2 | 1/2013 | Roohparvar et al. | |
| 2001/0040824 A1 | 11/2001 | Banks | |
| 2002/0156975 A1 | 10/2002 | Staub et al. | |
| 2006/0140007 A1 | 6/2006 | Cernea et al. | |
| 2007/0025157 A1 | 2/2007 | Wan et al. | |
| 2007/0153594 A1 | 7/2007 | Chen | |
| 2007/0263450 A1 | 11/2007 | Cernea et al. | |
| 2007/0291543 A1 | 12/2007 | Mokhlesi | |
| 2008/0127104 A1 | 5/2008 | Li et al. | |
| 2008/0198662 A1 | 8/2008 | Mokhlesi | |
| 2008/0247228 A1 | 10/2008 | Nguyen et al. | |
| 2009/0059660 A1 | 3/2009 | Lee et al. | |
| 2009/0080255 A1 * | 3/2009 | Arita | 365/185.09 |
| 2009/0097325 A1 | 4/2009 | Won et al. | |
| 2009/0103365 A1 | 4/2009 | Roohparvar et al. | |
| 2009/0168542 A1 | 7/2009 | Hamada et al. | |
| 2010/0027332 A1 | 2/2010 | Lee et al. | |
| 2010/0296344 A1 * | 11/2010 | Kim et al. | 365/185.19 |
| 2011/0019478 A1 * | 1/2011 | Roohparvar et al. | 365/185.17 |
| 2012/0075931 A1 | 3/2012 | Yuh | |
| 2013/0176776 A1 * | 7/2013 | Nguyen et al. | 365/185.03 |
| 2013/0176777 A1 * | 7/2013 | Nguyen et al. | 365/185.03 |

FOREIGN PATENT DOCUMENTS

| | | |
|---|---|---|
| JP | 2001-167589 A | 6/2001 |
| TW | 490671 | 6/2002 |
| WO | WO 2004/053882 A1 | 6/2004 |
| WO | WO 2008/103586 A1 | 8/2008 |

OTHER PUBLICATIONS

Office Action for U.S. Appl. No. 13/570,746 mailed Nov. 4, 2013, 7 pages.
Notification of Transmittal of the International Search Report and the Written Opinion of the International Searching Authority, of the Declaration for Int'l Appl. No. PCT/US2012/069817 mailed Apr. 3, 2013, 17 pages.
Office Action for U.S. Appl. No. 13/570,779 mailed Mar. 11, 2014, 21 pages.

* cited by examiner

Programming into Four States Represented by a 2-bit Code

Conventional Programming with Alternating
Program/Verify Sequence for a 4-state Memory

CHARGE CYCLING BY EQUALIZING THE SOURCE AND BIT LINE LEVELS BETWEEN PULSES DURING NO-VERIFY WRITE OPERATIONS FOR NAND FLASH MEMORY

CROSS-REFERENCE TO RELATED PATENT APPLICATIONS

This application claims priority from provisional application 61/583,764, filed Jan. 6, 2012, and is related to the following applications, both filed on Aug. 9, 2012: U.S. patent application Ser. No. 13/570,746, entitled "Charge Cycling by Equalizing and Regulating the Source, Well, and Bit Line Levels During Write Operations for NAND Flash Memory: Program to Verify Transition" by Hao That Nguyen, Juan Lee, Seungpil Lee, Masahide Matsumoto, Jong Park, Man Mui, and Sung-En Wang, published as US patent publication 2013-0176776; and U.S. patent application Ser. No. 13/570,779, application entitled "Charge Cycling by Equalizing and Regulating the Source, Well, and Bit Line Levels During Write Operations for NAND Flash Memory: Verify to Program Transition", by Hao That Nguyen, Juan Lee, Seungpil Lee, Jong Park and Man Mui, published as US patent publication 2013-0176777.

FIELD OF THE INVENTION

This invention relates generally to semiconductor memory circuits such as electrically erasable programmable read-only memory (EEPROM) and flash EEPROM, and specifically to techniques for the writing of data to such devices.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling). Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

There is an ongoing effort to increase the performance of such memories. The programming of data into non-volatile memories is one of the more time, current and power consuming operations. A write operation typically consisted of an alternating series of programming operations, where selected memory cells receive a high-voltage programming pulse, and verify operations, where the pulsed cells are individually checked to determine whether or not they have reached their target data state. Consequently, there is a need to increase the speed and efficient of write operations, whether for the pulse or verify phase.

SUMMARY OF INVENTION

According to a first set of aspects, a method is presented for the programming of a non-volatile memory circuit having non-volatile memory cells formed along a plurality of bit lines and a plurality of word lines according to a NAND type architecture. An alternating plurality of pulse and verify operations are performed on the memory cells along a selected word line. A pulse operation includes: individually biasing the bit lines to one of a plurality of values, including a program inhibit level and a program enable level; biasing a common source line for the bit lines to a first non-zero voltage level; and applying a programming pulse to the selected word line while the bit lines and common source line are so biased. A verify operation includes: biasing the bit lines to a verify level; and concurrently biasing the common source line to a second non-zero voltage level. Subsequent to the pulse operations and prior to the subsequent verify operation, the bit lines and the common source line are equalized at a non-zero voltage level.

Other aspects include a non-volatile memory circuit. The memory circuit includes an array of non-volatile memory cells formed along a plurality of bit lines and a plurality of word lines according to a NAND type architecture and program and sense circuitry connectable to the array to perform a write operation including an alternating series of pulse and verify operations. The memory circuit also has regulation circuitry and control circuitry. The regulation circuitry includes: a comparator having a first input connected to receive a reference voltage and a second input connected to receive feedback from the comparator's output; a first switch connected to supply the output of the comparator to the bit lines in response to a control signal being asserted; and a second switch connected to supply the output of the comparator to a common source line of the array in response to the control signal being asserted. The control circuitry is connected to the program and sense circuitry and the regulation circuitry, wherein during a write operation the control circuitry asserts the control signal during the transition from a pulse operation to the subsequent verify operation.

In another set of aspects, a method is presented for the programming of a non-volatile memory circuit having non-volatile memory cells formed along a plurality of bit lines and a plurality of word lines according to a NAND type architecture. An alternating plurality of pulse and verify operations are performed on the memory cells along a selected word line. A pulse operation includes: individually biasing the bit lines to one of a plurality of values, including a program inhibit level and a program enable level; biasing a common source line for the bit lines to a first non-zero voltage level; and applying a programming pulse to the selected word line while the bit lines and common source line are so biased. A verify operation includes: biasing the bit lines to a verify level; and concurrently biasing the common source line to a second non-zero voltage level. Subsequent to the verify operations and prior to the subsequent pulse operation, the bit lines and the common source line are equalized at a non-zero voltage level.

Further aspects relate to a non-volatile memory circuit. The circuit includes an array of non-volatile memory cells formed along a plurality of bit lines and a plurality of word lines according to a NAND type architecture. The circuit also includes read and write circuitry connectable to the array to perform an alternating plurality of pulse and verify operations to the memory cells along a selected word line. A pulse operation includes: individually biasing the bit lines to one of a plurality of values, including a program inhibit level and a program enable level; biasing a common source line for the bit lines to a first non-zero voltage level; and applying a programming pulse to the selected word line while the bit lines and common source line are so biased. A verify operation includes: biasing the bit lines to a verify level; and concurrently biasing the common source line to a second non-zero voltage level. Subsequent to the verify operations and prior to the subsequent pulse operation the read and write circuitry equalizes the bit lines and the common source line at a non-zero voltage level.

Additional aspects relate to a method of programming the memory cells along a selected word line in a non-volatile memory circuit having non-volatile memory cells formed along a plurality of bit lines and a plurality of word lines according to a NAND type architecture. The bit lines are individually biased to one of a plurality of values, including a program inhibit level and a program enable level. A common source line for the bit lines is biased to a first non-zero voltage level. A series of a plurality of programming pulses is applied to the selected word line while the bit lines and common source line are so biased, where the series of programming pulses are applied without intervening verify operations. The common source line is maintained at the first non-zero voltage level between the individual pulses of the series of programming pulses, and bit lines biased at the program inhibit level are maintained at the program inhibit level between the individual pulses of the series of programming pulses.

Still further aspects concern a non-volatile memory circuit including an array of non-volatile memory cells formed along a plurality of bit lines and a plurality of word lines according to a NAND type architecture. The memory circuit also includes biasing circuitry connectable to the bit lines, to individually bias the bit lines to one of a plurality of values, including a program inhibit level and a program enable level, and connectable to a common source line for the bit lines to bias the common source line to a first non-zero voltage level. Programming circuitry is connectable to a selected word line to apply a series of a plurality of programming pulses to the selected word line while the bit lines are individually bias the bit lines to a selected one of a plurality of values and the common source line is biased to the first non-zero voltage level. The series of programming pulses are applied without intervening verify operations, wherein the common source line is maintained at the first non-zero voltage level between the individual pulses of the series of programming pulses, and wherein bit lines biased at the program inhibit level are maintained at the program inhibit level between the individual pulses of the series of programming pulses.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION OF THE PREFERRED EMBODIMENTS

Memory System

FIG. 1 to FIG. 11 illustrate example memory systems in which the various aspects of the present invention may be implemented.

Figure 1:
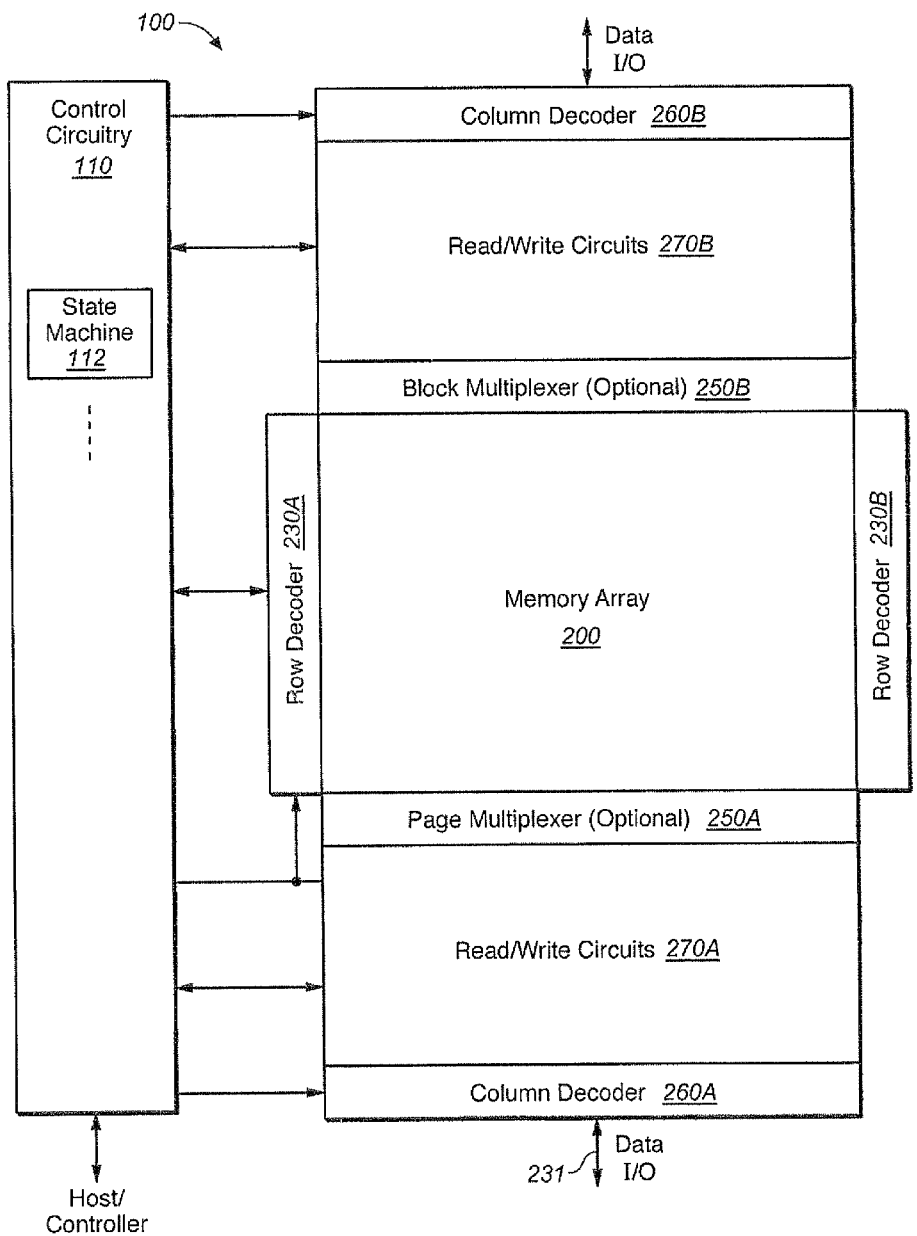
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
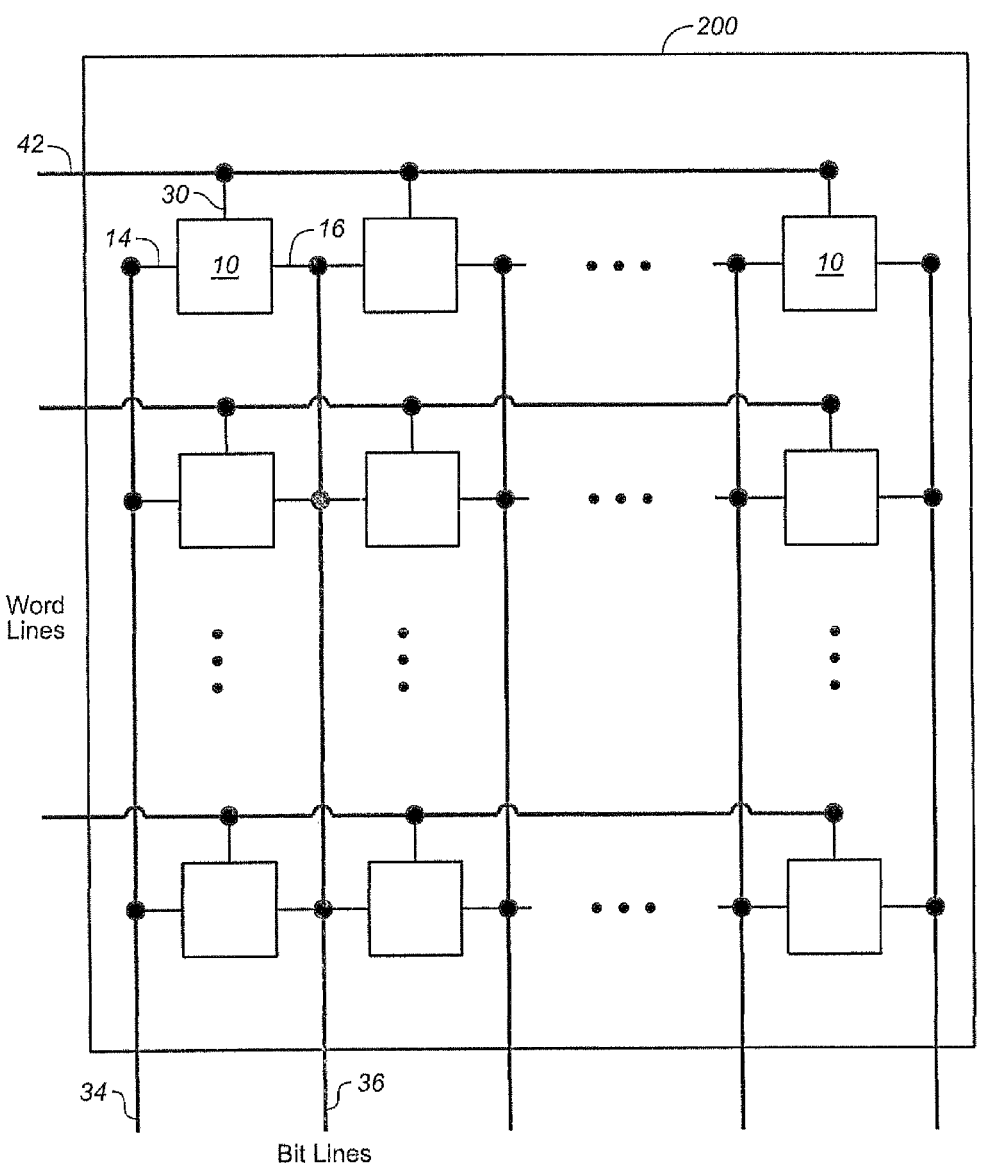
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
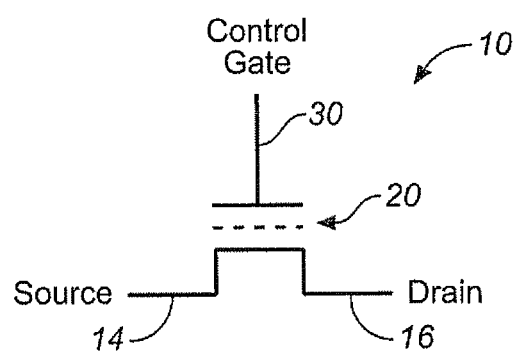
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
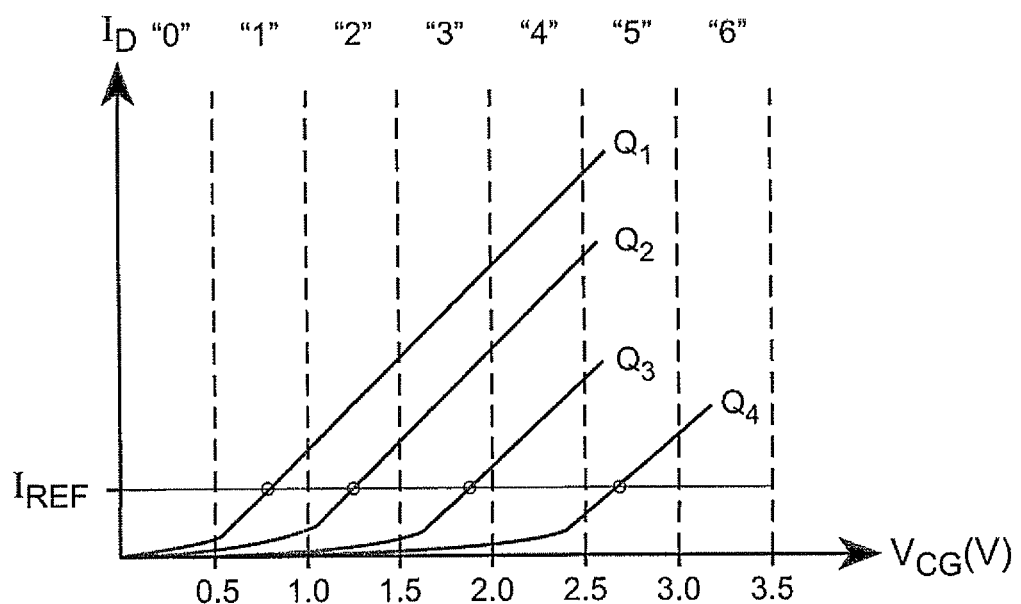
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
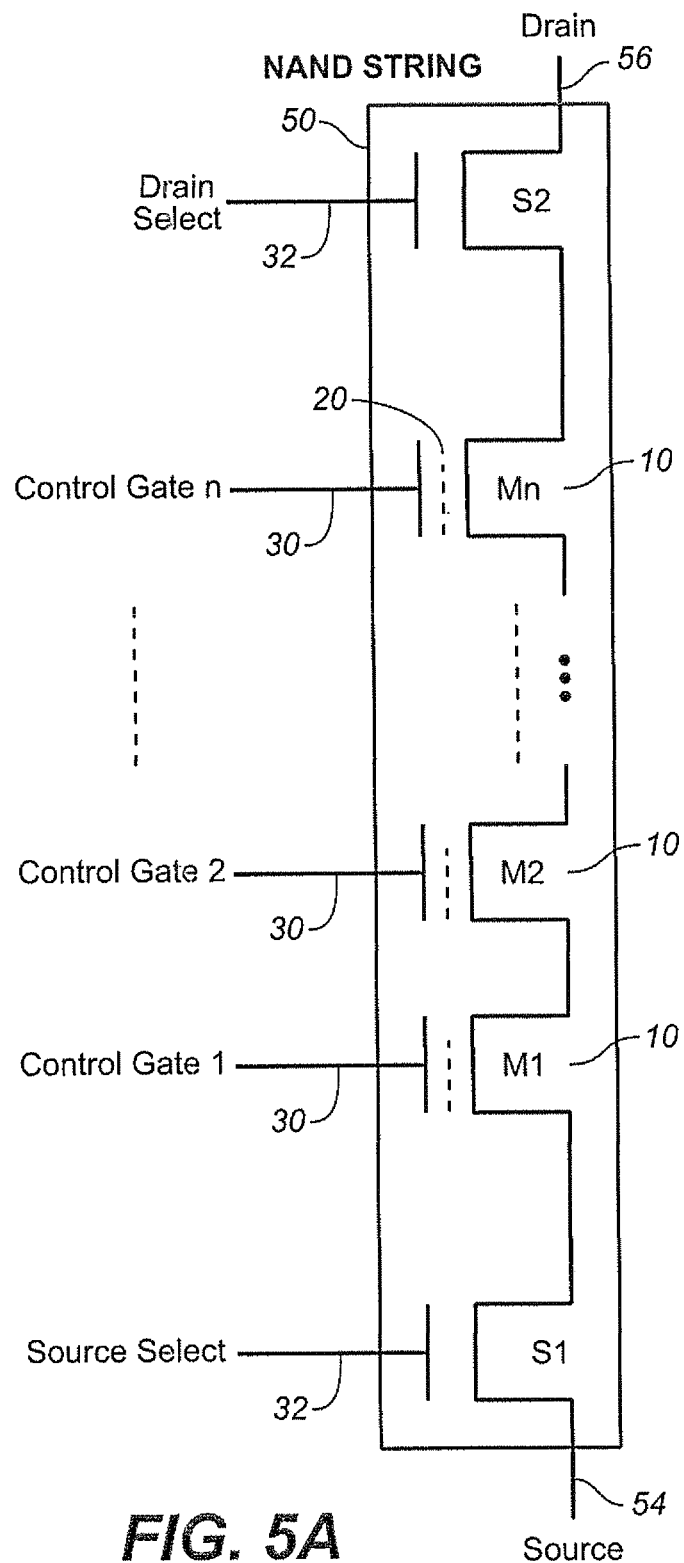
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . , Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
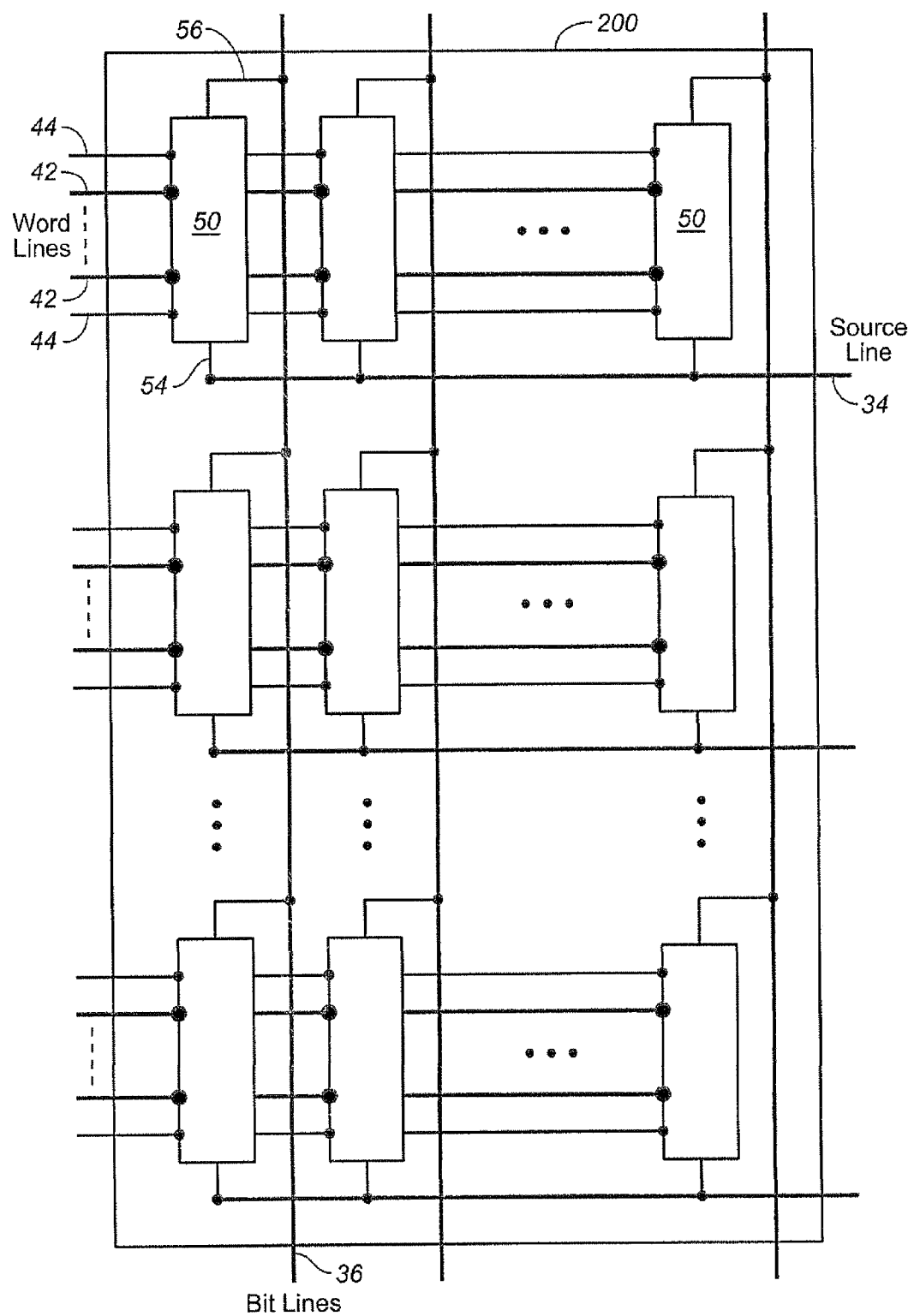
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
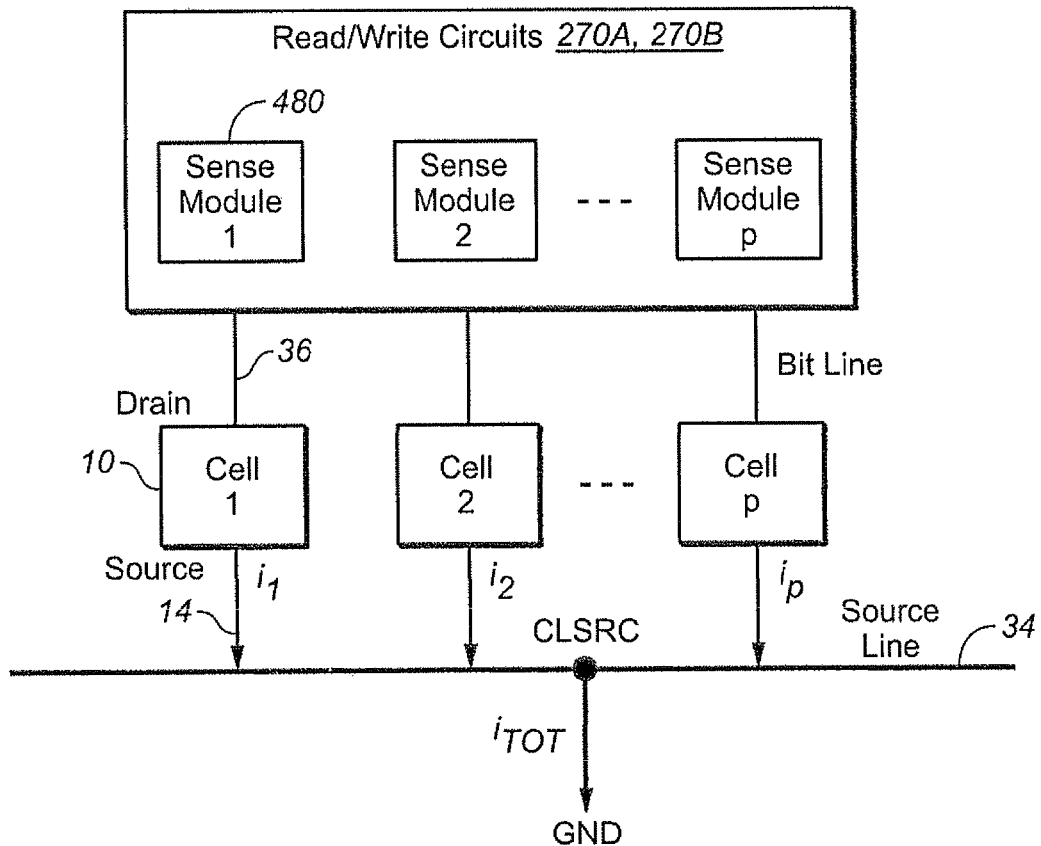
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
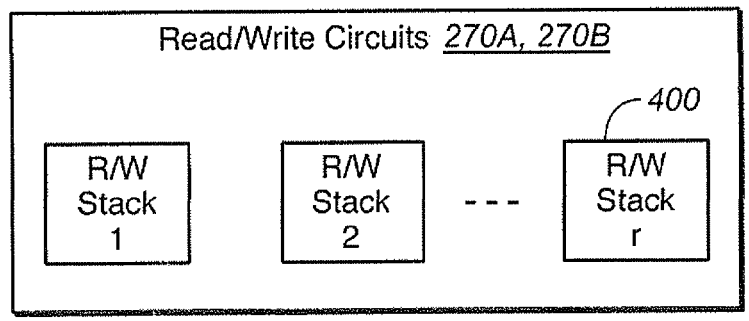
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8:
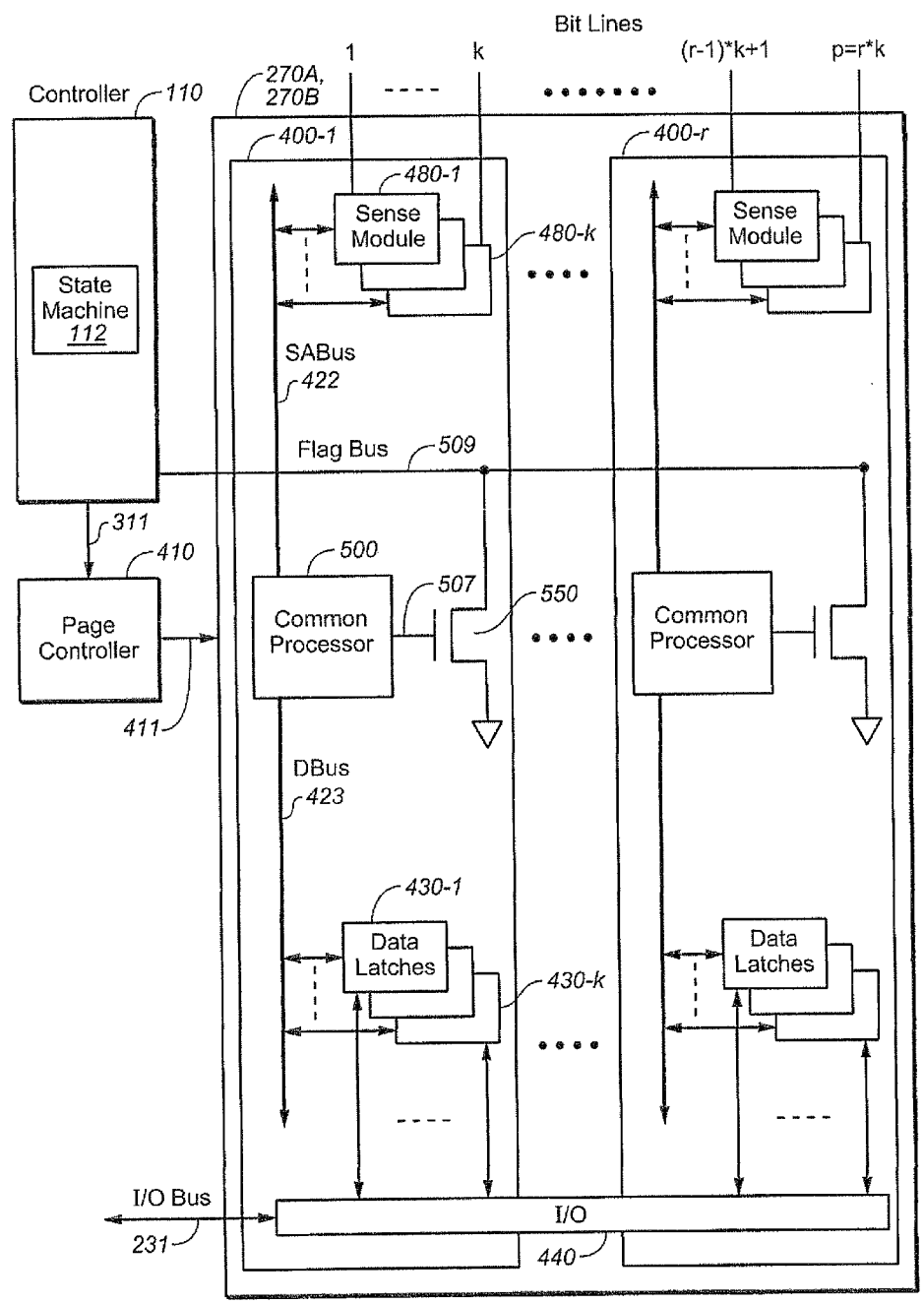
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, ..., 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably pre-charged by the controller 310 and will be pulled down when a status signal is asserted by any of the read/write stacks.

Examples of Multi-State Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
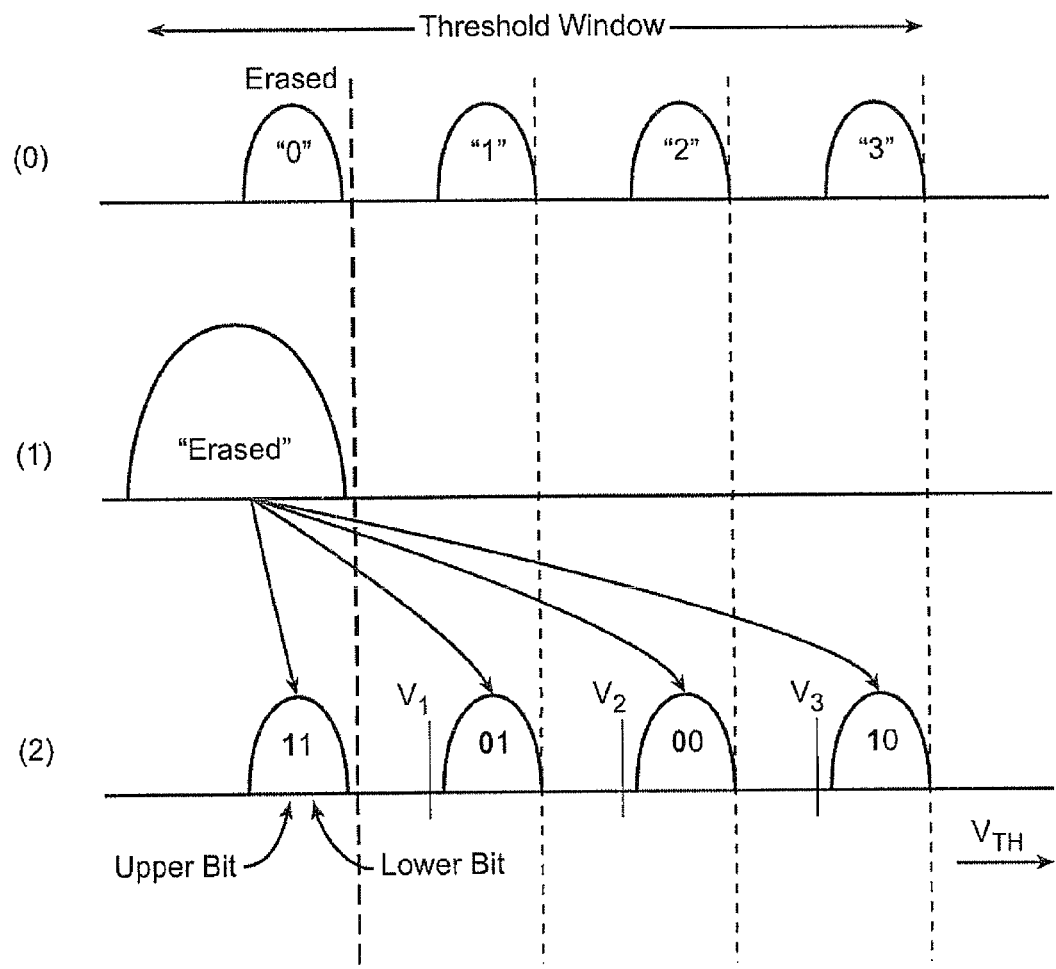
FIG. 9(0)-9(2) illustrate an example of programming a population of 4-state memory cells.

FIG. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $V_1$, $V_2$ and $V_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $V_1$, $V_2$ and $V_3$ in three sub-passes respectively.

Figure 10:
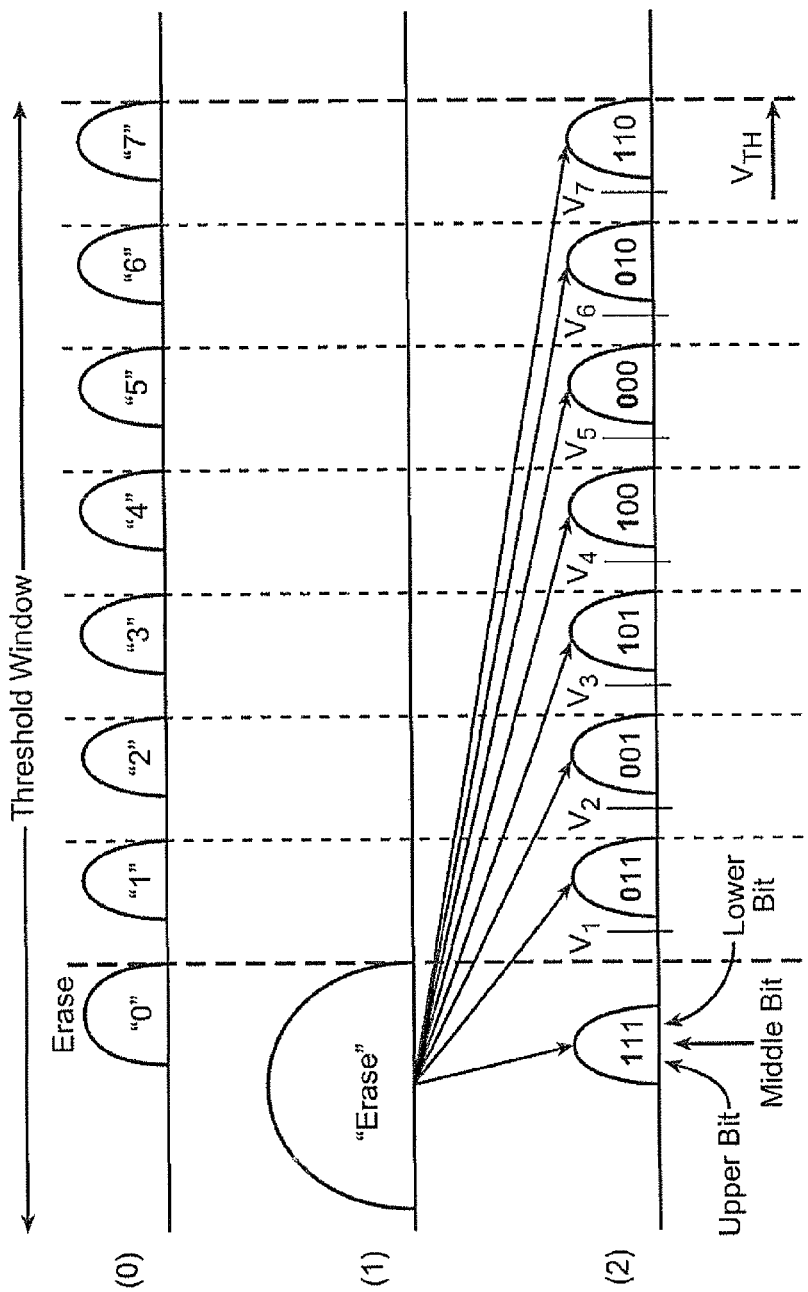
FIG. 10(0)-10(2) illustrate an example of programming a population of 8-state memory cells.

FIG. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $V_1$-$V_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101', "100", "000", '010" and '110". The 3-bit data may be read from the memory by sensing in "full-sequence" mode where the three bits are sensed together by sensing relative to the read demarcation threshold values $V_1$, -$V_7$ in seven sub-passes respectively.

Page or Word-Line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once they have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Since a verifying take place after a programming pulse and each verifying may be relative to a number of verify levels, various "smart" verifying schemes have been implemented to reduce the total number of verifying operations. For example, since the pulse by pulse programming increasing programs the population of cells towards higher and higher threshold levels, verifying relative to a higher verify level needs not start until a certain pulse. An example of a programming technique with smart verify is disclosed in U.S. Pat. No. 7,243,275, "SMART VERIFY FOR MULTI-STATE MEMORIES" by Gongwer et al., issued 10 Jul. 2007, and assigned to the same assignee as the present application. The entire disclosure of U.S. Pat. No. 7,243,275 is incorporated herein by reference.

Figure 11:
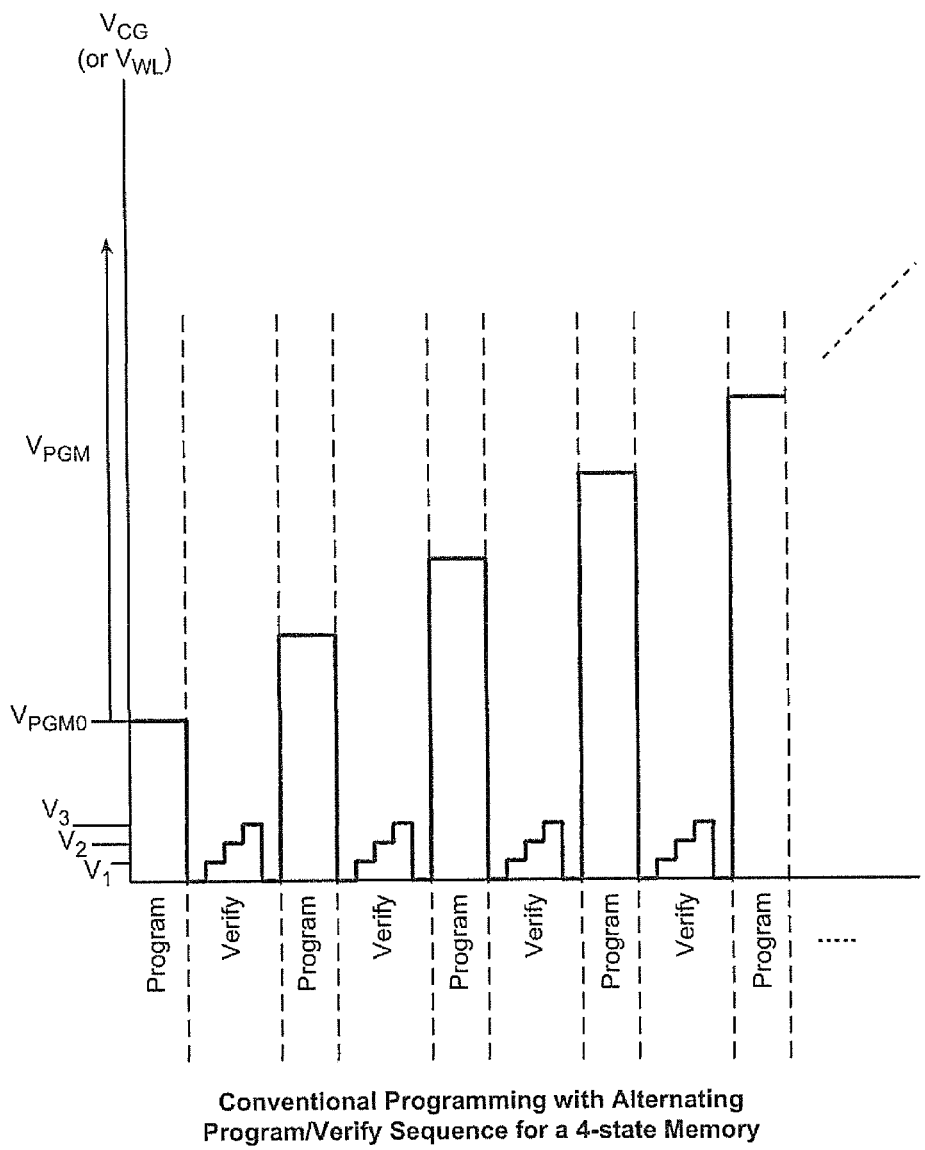
FIG. 11 illustrates a conventional technique for programming a 4-state memory cell to a target memory state.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series or programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

Charge Cycling by Equalizing and Regulating the Source, Well, and Bit Line Levels During Write Operations As just discussed with respect to FIG. 11, a program operation is typically divided into two parts or alternating phases, the program pulse and subsequent verify. After a high voltage program pulse $V_{PGM}$, the verify operation follows to check if each of the cells pass by verifying as being programmed to their corresponding target states. The verify operation is basically a sensing operation to check the individual cells' threshold voltages, Vt, with the selected word line voltage being set to the various verify voltage levels, such as the three levels shown in FIG. 11 for a 4-state embodiment. In addition to the voltage levels on the word line, the bit lines, source, and well levels of the array must all be biased properly for both the pulse and verify. This section considers the voltage levels on the source, bit lines, and well of an array or plane during the interval after a pulse before the verify operation, the interval after the verify phase before the next pulse, and, for cases where there is no inter-pulse verify, the interval between pulses. (The levels on the word lines between the pulse and verify are considered in U.S. patent application Ser. No. 12/893,611, filed Sep. 29, 2010, which could also be employed with the following embodiments.) As a write operation typically involves a number of iterations the pulse, verify process, decreasing this inter-phase time can improve device performance. Similarly, reducing power consumption and the amount of current (both peak and average) used are also important considerations. First, the period after the pulse, but before the verify, is considered:

Transition from Program to Verify

During the transition from a program pulse to the subsequent program verify operation, the typically procedure is to discharge the source, well, and bit lines to ground (or, more generally VSS), and then to re-establish the needed bias conditions for sensing operations of the verify operation. This is illustrated by the upper set of waveforms in FIG. 12, starting from the left. In preparation for the programming pulse, the bit lines are set to either facilitate (ground or VSS) or inhibit programming (VDDSA), as shown in the top (BL) trace. The exemplary embodiment here also includes the possibility of partially inhibited programming in the sort of Quick Pass Write (QPW) of the middle level (VQPW), such as is described further in U.S. Pat. No. 7,158,421. The source level is also raised above VSS (to a value Vtn or also SDDSA), as shown in the SRC trace, and well is at ground (or VSS), as shown in the bottom trace. Here the well is biased to Vss. Once the bias levels are established, the programming pulse is then applied along selected word lines. Under the typical prior art arrangement, before setting the bias levels for the verify phase, the bit lines, well and source were discharged to VSS before being charge back up for the verify levels to be applied to the word lines. This reset phase is shown in the shaded region, with the verify bias levels being set between the broken vertical lines.

The reset process of discharging these levels to VSS and then pre-charging again for the verify phase is a waste of time and charge. To avoid this, rather than discharging the source, bit lines and well, at the end of the programming pulse they are instead equalized together to some DC level, after which the memory system regulates them to a desired level (such as V_SRC=1.5V, for example), before being set for the subsequence operation. This is shown in the bottom set of traces for FIG. 12.

Figures 12, 12A:
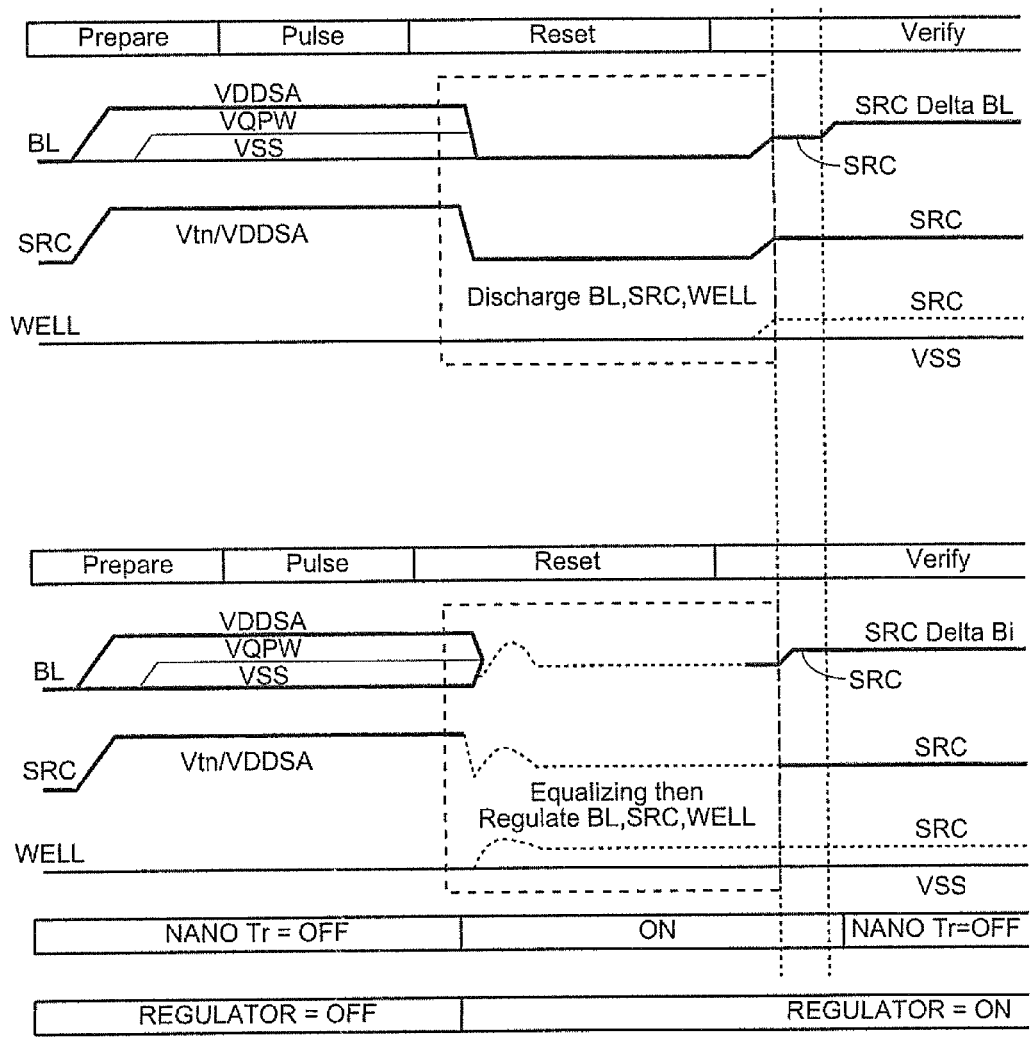
FIG. 12 illustrates a prior art arrangement and exemplary embodiments for the bit line, source and well levels for the intervals between the program and verify phases of a write operation.
Figure 12B:
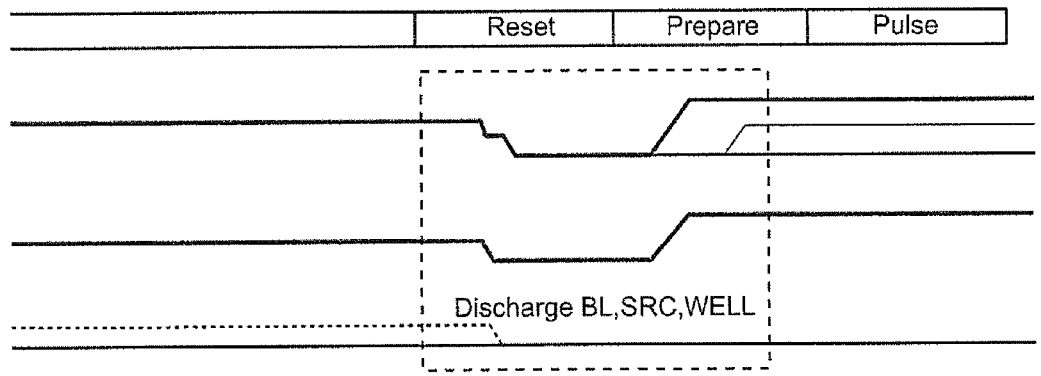
Figure 12B:
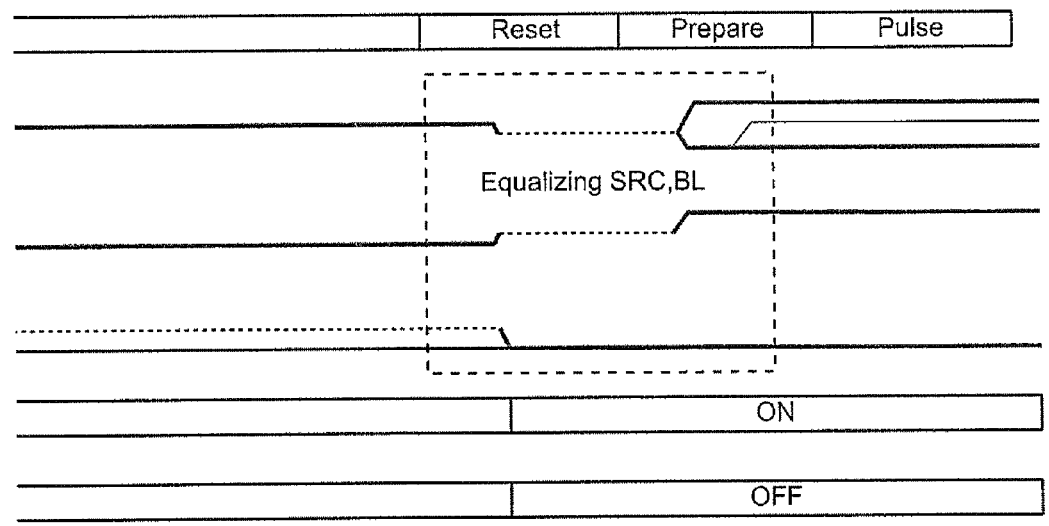

In the bottom part of the FIG. 12, the levels are same as before until after the pulse is applied. During the subsequent reset, as shown in the shaded region, the bit line and source level are then equalized (after some transitory behavior) and then regulated at the desired level, as shown in the shaded region. With respect to the well level, depending on the embodiment, this may either be at ground or at some non-zero level during verify, such as source verify level of V_SRC shown in FIG. 12, depending on what level is used for the well during the subsequent verify. If the well is to be raised during the verify phase, this is also equalized and then regulated at the same level; otherwise, it can be kept at ground.

Going into the verify phase, the source line is already at V_SRC and is just kept there. In the exemplary embodiment, the bit line is then pre-charged to a somewhat higher level of V_SRC by an offset Delta_BL for the sensing operation. The well is either at VSS, having been kept there during the transition, or at a different level, depending on the embodiment used for sensing. In the alternated exemplary embodiment, the well is set at V_SRC during verify, have been equalized and then regulated at this level during the pulse to verify transition.

Figure 13:
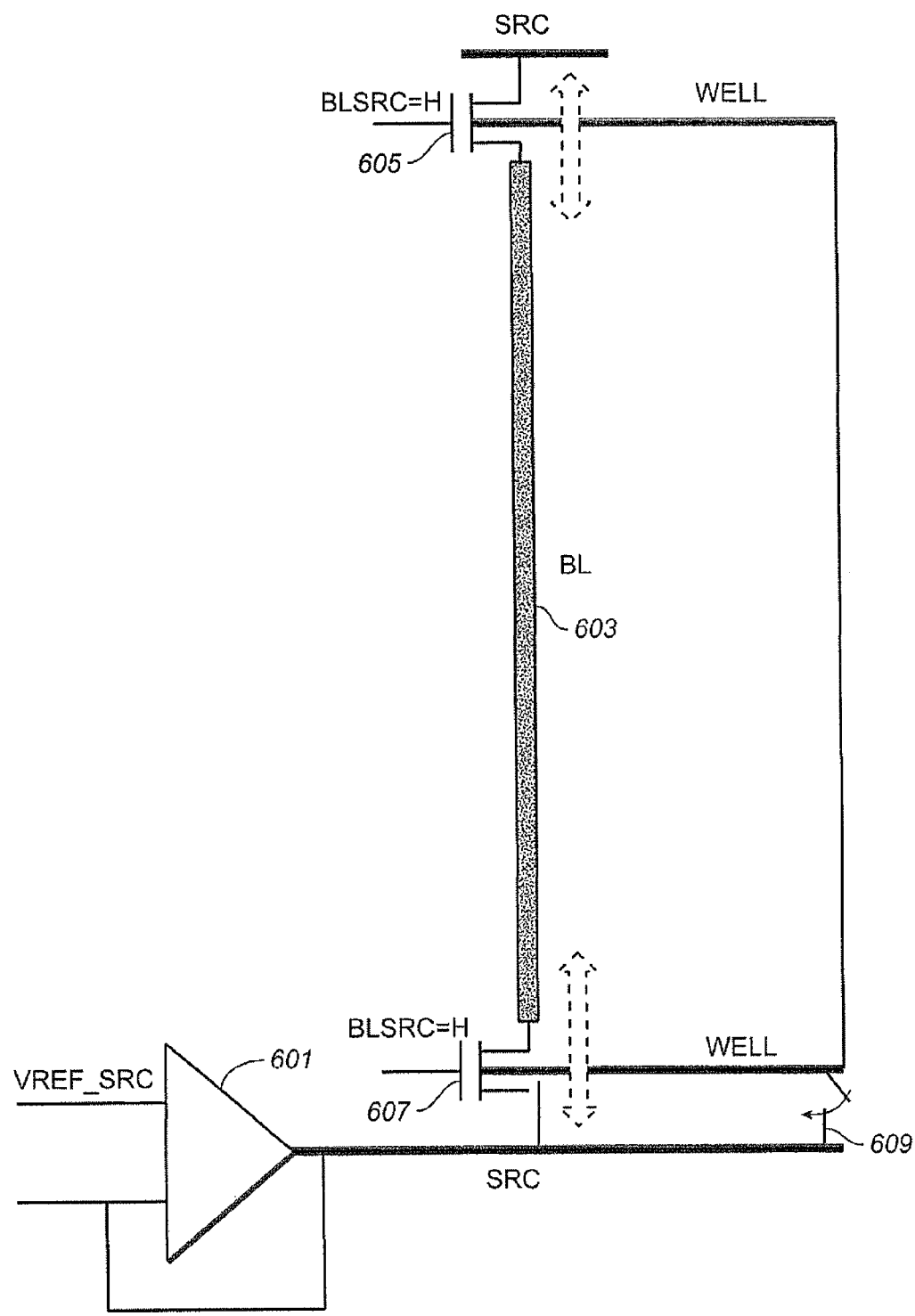
FIG. 13 schematically represents some of the elements for implementing the exemplary embodiment.

FIG. 13 shows schematically illustrates the sort of arrangement that can be used for this sort equalization and regulation. Here BL 603 represents the bit lines that are biased together in the process. In the exemplary embodiment, this will be all of the global bit lines of a given plane or array that run across the selected bit lines, but other arrangements can also be used. A transistor at either end (605, 607) is then used to connect the bit line to the same level as the source when turned on, where the high level to the control gate of 605, 607 needs to be sufficient to pass the voltage. A switch 609 allows the well to also be set and regulated at the SRC level, if this option is used. The regulation is then accomplished through the op-amp 601 that has a reference voltage (VREF_SRC) at one input and has feedback from the SRC level at the other input. Returning to FIG. 12, across the bottom is shown when the transistors 605, 607 are off (Tr=OFF) and on (ON) and, below that, when the regulation is on and off.

Once the reset is complete, as the bias levels for verify are then set as shown in the regions between the two broken vertical lines. As the bit lines, source, and well are already at or near the desired level, the desired biases are more readily achieved. Although FIG. 12 shows the reset (shaded area) and bias (between the broken horizontal lines) to be the same in both sets of waveforms so that they can more easily be compared, these are not actually to scale as, under the arrangement here, both the rest and subsequent bias can be done more quickly, saving time at each pulse/verify cycle.

In the described process, the memory can recycle the charge and regulate the levels ahead of time for the next verify waveform. This has several advantages. A first is to save on the average amount of current being drawn due to charge cycling. Another is to improve performance by reducing the discharge time at the end of program pulse and pre-charge time at the beginning of verify pulse. This also reduces the peak current draw during bit line pre-charge as the bit lines and source (and also well, if wanted) are already at the SRC level. Additionally, as the bit lines are already at the bias level used during the verify sense operation (SRC), this largely removes the potential for current leakage through the sense amps when pre-charging for the verify. Further, it will minimize the negative bit line-bit line coupling between inhibited-uninhibited bit lines at the end of a program pulse. Consequently, performance is improved by reducing the discharge time after a pulse and of the pre-charge time before verify of the bit line, source and well levels. As memory device scale down, such performance becomes more important, as do the reductions in peak and average current draws.

The introduction of the transistors 605, 607, as well as the regulation, help to reduce the bit line discharge times by several percent in each plane of the device. When the described mode is implemented, the memory can cycle the charge from previous operation and use it for the forward operation, reduce the average amount of current drawn. The specific amount of current saved will depend on the data pattern. Peak current is also reduced, as the starting point for pre-charging the bit lines and source is already at a DC level near to the final level, rather than VSS. With this mode implemented, as negative coupling from bit line to bit is minimized, reducing the possible of forward bias junction.

Transition from Verify to Program

Next the transition interval from the verify operation is considered; and, although this will again be discussed with respect FIG. 12 that shows both the period before the verify (as discussed above) and will as the period after the verify, these two aspects can be used independently. Returning to the top set of waveforms of FIG. 12, following the verify operation, the levels are again reset and then prepared for the next pulse (unless all of the cells have locked out or there is otherwise not a subsequent pulse). During this transition period from verify to program, the typical process has been to discharge the bit line, well, and source levels back ground/VSS before charging them back up to the bias levels for the next pulse. This process of discharge and subsequent pre-charge again is a waste of time and charge.

In the aspects described here, rather than discharge of the BL and SRC to ground, the exemplary embodiment instead equalizes the source and bit line levels together to some DC level. Then during the pre-charge time to prepare for the program pulse, the system then charges the bit lines either high or to VSS (or to the intermediate quick pass write level) as appropriate. The source level is also connected to the desired level as well. In doing this, the system recycles the charge ahead of time for the next program pulse.

As shown in FIG. 12 in the bottom set of waveforms, as the verify phase concludes, the bit line level is V_SRC+Delta_BL and the source level is V_SRC. These levels are then equalized. Here the shown level is intermediate between the two levels values from the verify phase, as is typical when the well has been at ground. For cases when the well was elevated (such as to V_SRC) during the verify, due to coupling to the well, when the well is taken to ground during the reset, this will pull the common BL/SRC level somewhat lower, closer to or even below the V_SRC level. After this equalization, the levels are then prepared for the next pulse. (This is assuming that this is at a point in the write process where these is a next pulse.)

This arrangement again saves on average current through charge cycling. Performance is also improved by reducing the discharge time at the end of verify waveform. As in the program to verify reset period, this transition period is shown to be of the same duration for comparison purposes, but could again be shorter in an actual implementation.

Transition Between Back to Back Programming Pulses

This sub-section now considers the case when back to back programming pulses are used without an intervening verify operation (a "reduce verify" or "predictive program" mode), such as described in U.S. Pat. No. 7,643,348 and U.S. Pat. No. 7,800,945, for example. As described further in these references, in this mode the memory predicts the number of pulses needed and skips the inter-pulse verify operations accordingly. Since a multi-state memory will have difference cells requiring different amount of threshold shifting, different bit lines can be switched from program enable to, program inhibit after differing number of pulsed based on the corresponding cells target state. This predictive mode can be combined with the usual pulse/verify sort of writing, with reduced verify mode occurring as a sub-phase of a write operation, with the standard alternate pulse/verify being used before the "reduce verify" section, after a "reduce verify" section, or both.

Figure 14A:
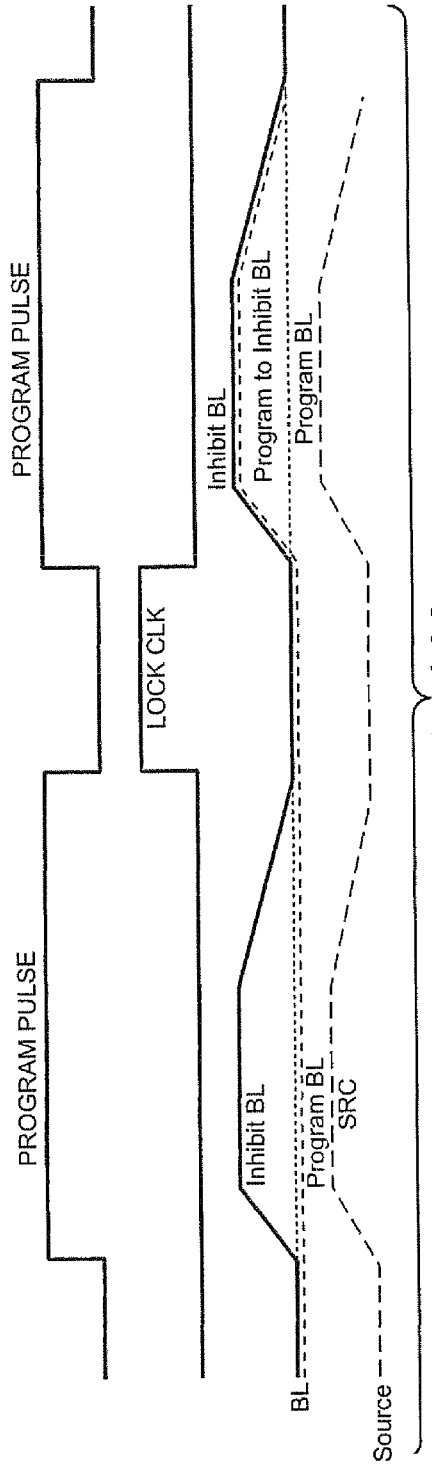
FIGS. 14A and 14B illustrates a prior art arrangement and exemplary embodiments for the bit line and source levels for the intervals between the program pulses when back to back programming pulses are used without an intervening verify.

In the exemplary embodiment, when the "reduce verify" mode is enabled, the back to back pulse case normally happens at the end of the program sequence. At the end of each of the program pulses, previous arrangements discharge the bit line and source to ground/VSS during the inter-pulse interval. This is illustrated in FIG. 14A. The top trace (Program Pulse) is high when the word line is being pulsed, while the lock clock is used to define the inter-pulse interval when the bit lines and source are discharged before the bit line and source biases are reestablished. As shown on the bit line (BL) wave form, inhibited bit lines are biased high for the pulse, while those to be programmed are low. After the pulse, the bit lines are discharged, before having their biases restored, which may include bit lines switching from program to inhibit. The source level is taken to its high level (SRC) for the pulse, then also discharged between pulsed before being taken back to SRC for the next pulse. Consequently, the memory is wasting power discharging bit lines and the source level, which will subsequently be charged back up again for the next program pulse.

Figure 14B:
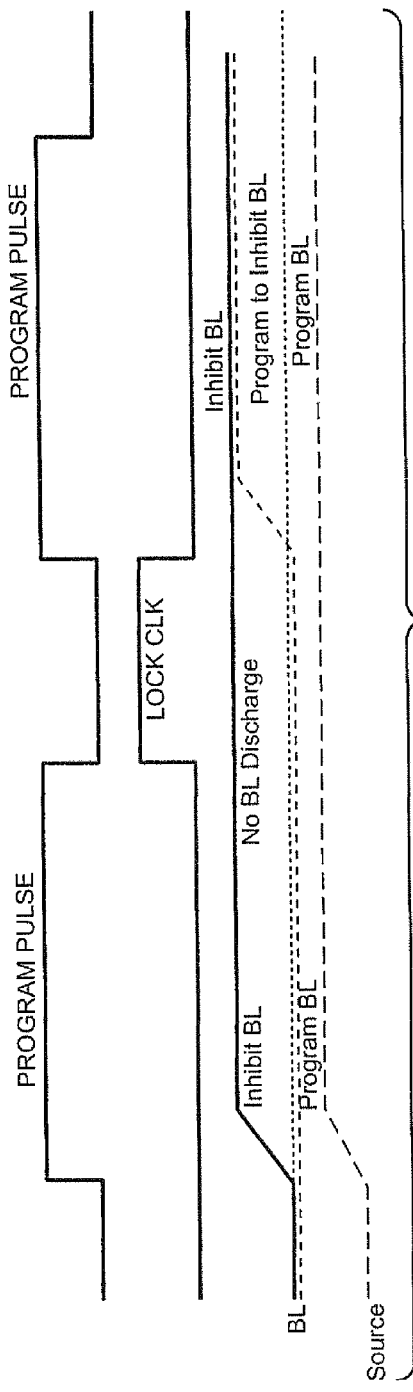

In the aspects described here, the exemplary embodiment instead floats the bit lines and source at the end of program pulse if it is known that the next operation is another program pulse. This is shown in FIG. 14B. Now, the bit lines are left to float, so that inhibited bit lines stay high, while those to be programmed stay low. For those bit lines that switch from program to inhibit, this can be done at the end of the inter-pulse period. For the source line, once raised, it can be left to float between pulses. Although the inter-pulse period is shown to be of the same length in both of FIGS. 14A and 14B for comparison purposes, by eliminating the inter-pulse discharge of the bit lines and source, the gap can be shortened quite a bit. Although the well level is not shown in FIGS. 14A and 14B, this can be at a typically level during program, such as ground as with FIG. 12.

The arrangement of FIG. 14B allows for a saving of average current as it eliminates the discharging of the bit lines and source level and pre-charging them again for the next pulse. Performance is improved by reducing the discharge-precharge time between pulses. The reduction in the amount of raising and lowering of bit line levels can also reduce negative effects of bit line to bit line coupling.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. In a non-volatile memory circuit having non-volatile memory cells formed along a plurality of bit lines and a plurality of word lines according to a NAND type architecture, a method of programming the memory cells along a selected word line comprising:
   individually biasing the bit lines to one of a plurality of values, including a program inhibit level and a program enable level;
   biasing a common source line for the bit lines to a first non-zero voltage level; and
   applying a series of a plurality of programming pulses to the selected word line while the bit lines and common source line are so biased, wherein the series of programming pulses are applied without intervening verify operations, wherein the common source line is maintained at the first non-zero voltage level between the individual pulses of the series of programming pulses, and wherein bit lines biased at the program inhibit level are maintained at the program inhibit level between the individual pulses of the series of programming pulses.

2. The method of claim 1, further comprising:
   subsequent to a first pulse of the series and prior to the pulse subsequent to the first pulse, changing the biasing on one or more of the bit lines from the program enable level to the program inhibit level.

3. The method of claim 2, wherein which of the one or more bit lines have the bias level changed from the program enable level to the program inhibit level and after which pulse the respective one or more bias levels are so changed, is determined prior to the first pulse of the series being applied to the selected word line.

4. The method of claim 1, wherein the memory cells are formed upon a well structure and the well structure is biased to ground while applying said series of a plurality of programming pulses.

5. The method of claim 1, wherein subsequent to applying said series of a plurality of programming pulses without intervening verify operations, applying one or more programming pulses to the selected word line with intervening verify operations being performed.

6. A non-volatile memory circuit comprising:
   an array of non-volatile memory cells formed along a plurality of bit lines and a plurality of word lines according to a NAND type architecture;
   biasing circuitry connectable to the bit lines to individually bias the bit lines to one of a plurality of values, including a program inhibit level and a program enable level and connectable to a common source line for the bit lines to bias the common source line to a first non-zero voltage level; and
   programming circuitry connectable to a selected word line to apply a series of a plurality of programming pulses to the selected word line while the bit lines are individually bias the bit lines to a selected one of a plurality of values and the common source line is biased to the first non-zero voltage level, wherein the series of programming pulses are applied without intervening verify operations, wherein the common source line is maintained at the first non-zero voltage level between the individual pulses of the series of programming pulses, and wherein bit lines biased at the program inhibit level are maintained at the program inhibit level between the individual pulses of the series of programming pulses.

7. The non-volatile memory circuit of claim 6, wherein subsequent to a first pulse of the series and prior to the pulse subsequent to the first pulse, the biasing on one or more of the bit lines is changed from the program enable level to the program inhibit level.

8. The non-volatile memory circuit of claim 7, wherein which of the one or more bit lines have the bias level changed from the program enable level to the program inhibit level and after which pulse the respective one or more bias levels are so changed, is determined prior to the first pulse of the series being applied to the selected word line.

9. The non-volatile memory circuit of claim 6, wherein the memory cells are formed upon a well structure and the well structure is biased to ground while applying said series of a plurality of programming pulses.

10. The non-volatile memory circuit of claim 6, wherein subsequent to applying said series of a plurality of programming pulses without intervening verify operations, applying one or more programming pulses to the selected word line with intervening verify operations being performed using sensing circuitry of the non-volatile memory circuit.

* * * * *